United States Patent
Tokuda et al.

(10) Patent No.: US 8,871,552 B2
(45) Date of Patent: Oct. 28, 2014

(54) METHOD OF MANUFACTURING RADIATION DETECTOR

(75) Inventors: Satoshi Tokuda, Kusatsu (JP); Koichi Tanabe, Uji (JP); Toshinori Yoshimuta, Takatsuki (JP); Hiroyuki Kishihara, Kizugawa (JP); Masatomo Kaino, Kyoto-fu (JP); Akina Yoshimatsu, Osaka (JP); Toshiyuki Sato, Kyoto (JP); Shoji Kuwabara, Ibaraki (JP)

(73) Assignees: Shimadzu Corporation, Kyoto (JP); Institute of National Colleges of Technology, Japan, Tokyo (JP)

( * ) Notice: Subject to any disclaimer, the term of this patent is extended or adjusted under 35 U.S.C. 154(b) by 0 days.

(21) Appl. No.: 13/808,894

(22) PCT Filed: Feb. 9, 2011

(86) PCT No.: PCT/JP2011/000733
§ 371 (c)(1),
(2), (4) Date: Jan. 7, 2013

(87) PCT Pub. No.: WO2012/004908
PCT Pub. Date: Jan. 12, 2012

(65) Prior Publication Data
US 2013/0115731 A1 May 9, 2013

(30) Foreign Application Priority Data

Jul. 6, 2010 (JP) .................................. 2010-154049

(51) Int. Cl.
| | |
|---|---|
| H01L 21/00 | (2006.01) |
| H01L 21/20 | (2006.01) |
| H01L 31/18 | (2006.01) |
| H01L 31/115 | (2006.01) |
| H01L 21/02 | (2006.01) |
| H01L 31/0296 | (2006.01) |
| H01L 27/146 | (2006.01) |

(52) U.S. Cl.
CPC ...... *H01L 21/02573* (2013.01); *H01L 31/1832* (2013.01); *H01L 31/115* (2013.01); *Y02E 10/50* (2013.01); *H01L 27/14692* (2013.01); *H01L 27/14696* (2013.01); *H01L 21/02562* (2013.01); *H01L 31/02966* (2013.01); *H01L 21/0262* (2013.01); *H01L 27/14659* (2013.01)
USPC ................... 438/57; 438/84; 438/93; 438/97; 438/488

(58) Field of Classification Search
None
See application file for complete search history.

(56) References Cited

U.S. PATENT DOCUMENTS

| | | | | |
|---|---|---|---|---|
| 4,141,777 A | * | 2/1979 | Matveev et al. | ................ 117/81 |
| 4,243,885 A | * | 1/1981 | Agouridis et al. | ....... 250/370.07 |

(Continued)

FOREIGN PATENT DOCUMENTS

| | | |
|---|---|---|
| JP | 2001-242255 A | 9/2001 |
| JP | 4269653 B | 5/2009 |

OTHER PUBLICATIONS

International Search Report issued in International Application No. PCT/JP2011/000733 mailed on May 17, 2011.

*Primary Examiner* — Scott B Geyer
(74) *Attorney, Agent, or Firm* — McDermott Will & Emery LLP (57) ABSTRACT

Although Cl (chlorine) is no longer supplied in the course of a first process in which a detecting layer formed by a polycrystalline film or a polycrystalline lamination film by vapor deposition or sublimation is formed, an additional source (e.g., HCl of Cl-containing gas) other than a source is supplied at the start or in the course of the first process. Thus, the detecting layer as the polycrystalline film or the polycrystalline lamination film of CdTe, ZnTe, or CdZnTe can be doped with Cl uniformly in a thickness direction from the start until the end of the first process in film formation. As a result, uniform crystal particles and uniform detection characteristics can be achieved.

20 Claims, 7 Drawing Sheets

(56) References Cited

U.S. PATENT DOCUMENTS

| | | | | |
|---|---|---|---|---|
| 4,804,638 A | * | 2/1989 | Hoke et al. | 117/104 |
| 4,950,615 A | * | 8/1990 | Basol et al. | 438/95 |
| 5,916,375 A | * | 6/1999 | Agui et al. | 136/258 |
| 6,251,701 B1 | * | 6/2001 | McCandless | 438/95 |
| 6,398,624 B1 | * | 6/2002 | Izumi et al. | 451/38 |
| 6,423,565 B1 | * | 7/2002 | Barth et al. | 438/57 |
| 6,512,233 B1 | * | 1/2003 | Sato et al. | 250/370.13 |
| 7,901,975 B2 | * | 3/2011 | Chen | 438/94 |
| 8,252,619 B2 | * | 8/2012 | Schaeffer et al. | 438/84 |
| 2004/0094721 A1 | | 5/2004 | Tokuda et al. | |
| 2005/0170649 A1 | * | 8/2005 | Hirano | 438/689 |
| 2010/0055827 A1 | * | 3/2010 | Barth et al. | 438/94 |
| 2010/0327172 A1 | * | 12/2010 | Tokuda et al. | 250/370.08 |
| 2011/0073034 A1 | * | 3/2011 | Basu et al. | 117/84 |

* cited by examiner

METHOD OF MANUFACTURING RADIATION DETECTOR

CROSS REFERENCE TO RELATED APPLICATIONS

This application is the U.S. National Phase under 35 U.S.C. §371 of International Application No. PCT/JP2011/000733, filed on Feb. 9, 2011, which in turn claims the benefit of Japanese Application No. 2010-154049, filed on Jul. 6, 2010, the disclosures of which Applications are incorporated by reference herein.

BACKGROUND OF THE INVENTION

1. Field of the Invention

This invention relates to a method of manufacturing a radiation detector having a function of detecting radiation including X-rays, gamma-rays, light, or the like for use in the medical, industrial, and nuclear fields. More particularly, this invention is directed to a technique in which a radiation-sensitive detecting layer is formed of a semiconductor which is formed of polycrystals.

2. Description of the Related Art

As conventional materials of a high-sensitive radiation detector, various semiconductor materials, especially a crystal of CdTe (cadmium telluride), ZnTe (zinc telluride), or CdZnTe (cadmium zinc telluride) have been studied and developed, and have been partially commercialized. However, in order to apply this to a radiation detector or a radiographic apparatus for medical diagnosis, it is necessary to form a radiation conversion layer having a large area (e.g., of a 20 cm square or more). It is not practical in technique and in cost to form a crystal having such a large area. Thus, a method has been disclosed of forming a polycrystalline film or a polycrystalline lamination film by close spaced sublimation. See, for example, Japanese Patent Publication No. 2001-242255.

In a smaller radiation detector using a CdTe bulk monocrystal, it has been known as effective to dope it with zinc (Zn) for decreasing a leakage current and to dope it with halogen, such as chlorine (Cl), for enhancing carrier mobility and thus enhancing detection characteristics. As a Cl-dope technique for a CdTe or CdZnTe polycrystalline film by close spaced sublimation, a method of forming a polycrystalline film or a polycrystalline lamination film has been disclosed by vapor deposition or sublimation using a mixture of a first material containing at least one of CdTe, ZnTe and CdZnTe and a second material containing at least one of $CdCl_2$ (cadmium chloride) and $ZnCl_2$ (zinc chloride) as a source. See, for example, Japanese Patent No. 4269653.

In the Cl-dope technique in the above-mentioned Japanese Patent No. 4269653, however, Cl compounds, such as $CdCl_2$ and $ZnCl_2$, are to be previously consumed at a lower melting point and a higher steam pressure rather than that of CdTe, ZnTe, or CdZnTe. Accordingly, chlorine (Cl) is no longer supplied during film formation, and only a portion adjacent to a substrate interface is doped with Cl in early film formation. Such problem has appeared.

Figure 8:
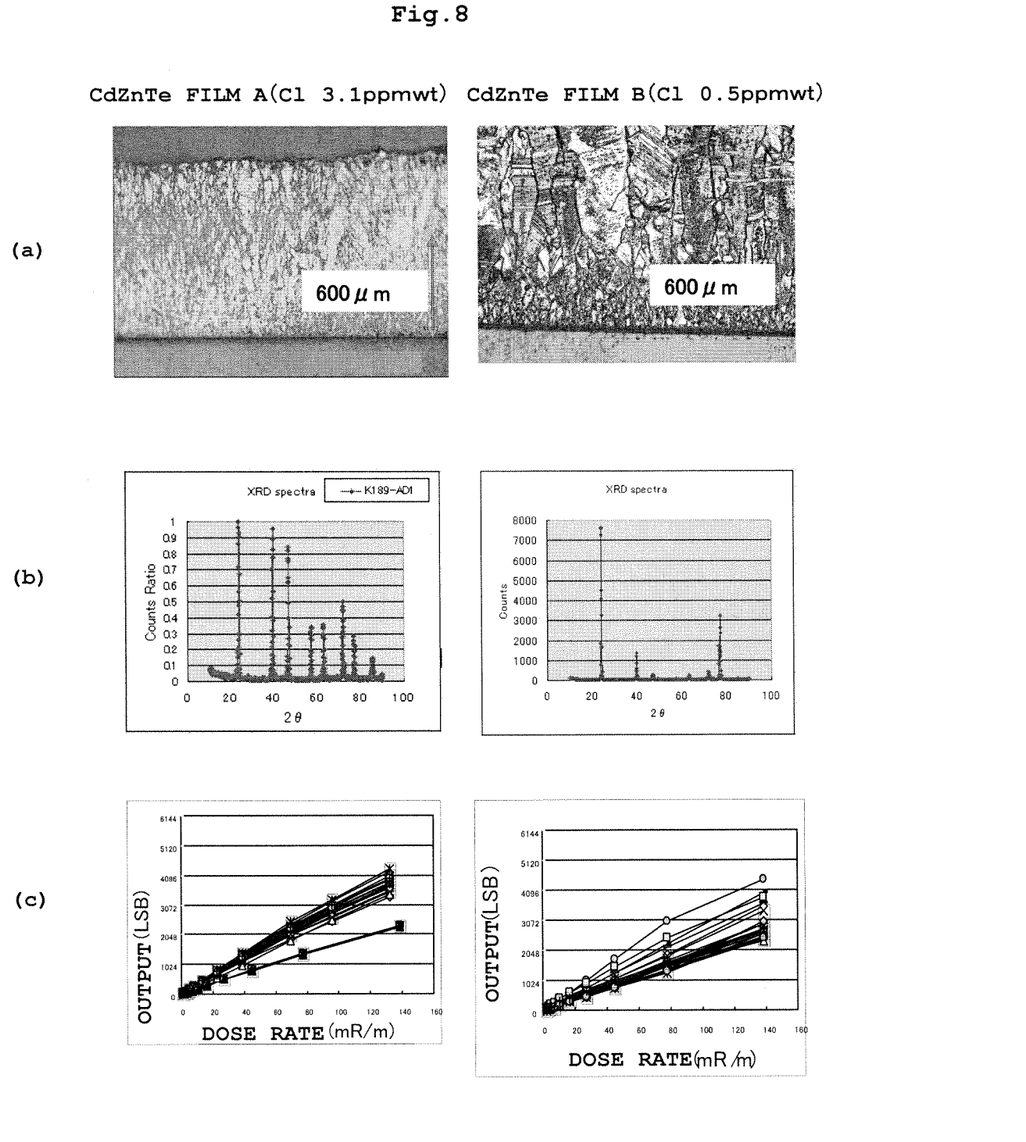
FIG. 8 is experimental data showing a relationship between a crystal particle diameter and pixel variation in sensitivity.

As shown in FIG. 8, crystal particles are smaller adjacent to the substrate interface doped with Cl, whereas they are larger in a portion not doped with Cl. Thus, it has been confirmed that crystal particles cannot be uniform. The non-uniform crystal particles cause non-uniform characteristics (e.g., a leakage current or sensitivity) in each pixel. In addition, temporal fluctuations become wider. These serving as a noise source leads to difficulty in sensitivity correction and deterioration in image characteristics (detection efficiency).

Accordingly, as in the third aspect of the above-mentioned Patent Publication No. 4269653, it has been suggested that the polycrystalline film or the polycrystalline lamination film is formed by the vapor deposition or sublimating with the above-mentioned source, and then is additionally doped with Cl. In this case, additional dope with Cl can achieve protection of the crystal particles. On the other hand, a diameter itself of the particles largely grown-up cannot be decreased. As a result, uniform crystal particles cannot still be obtained.

Moreover, regarding that Cl is not supplied during the film formation, it is also conceivable to increase a ratio of the second material represented by $CdCl_2$ (cadmium chloride) and $ZnCl_2$ (zinc chloride) so as to supply Cl continuously until the end of the film formation. On the other hand, it has been obvious from experimental data in FIG. 9 that the second material is gone firstly during the film formation even if the ration of the second material increases.

Figure 9:
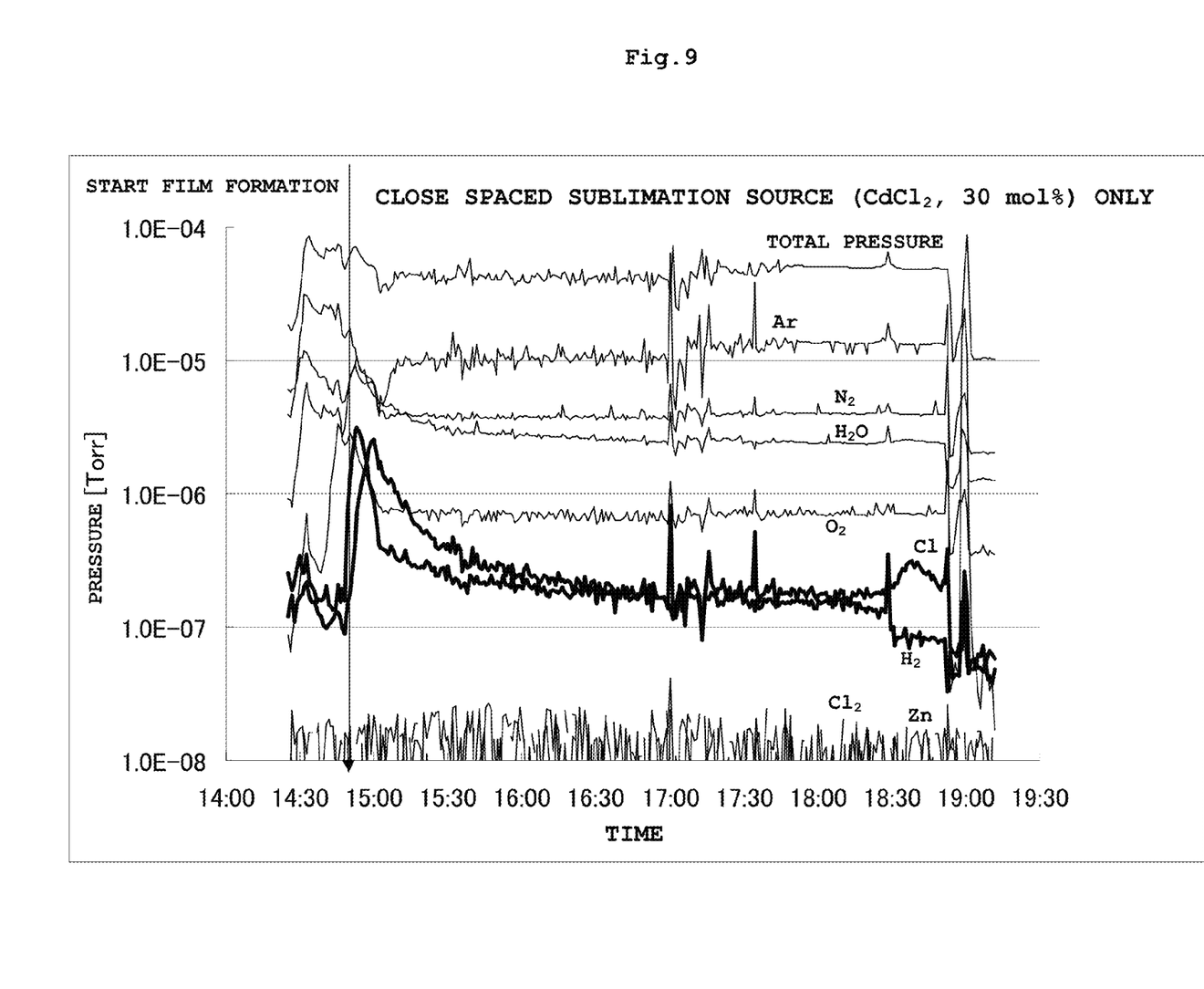
FIG. 9 is experimental data showing temporal variations in pressure for every component within a chamber when only $CdCl_2$ is used as a source.
Figure 10:
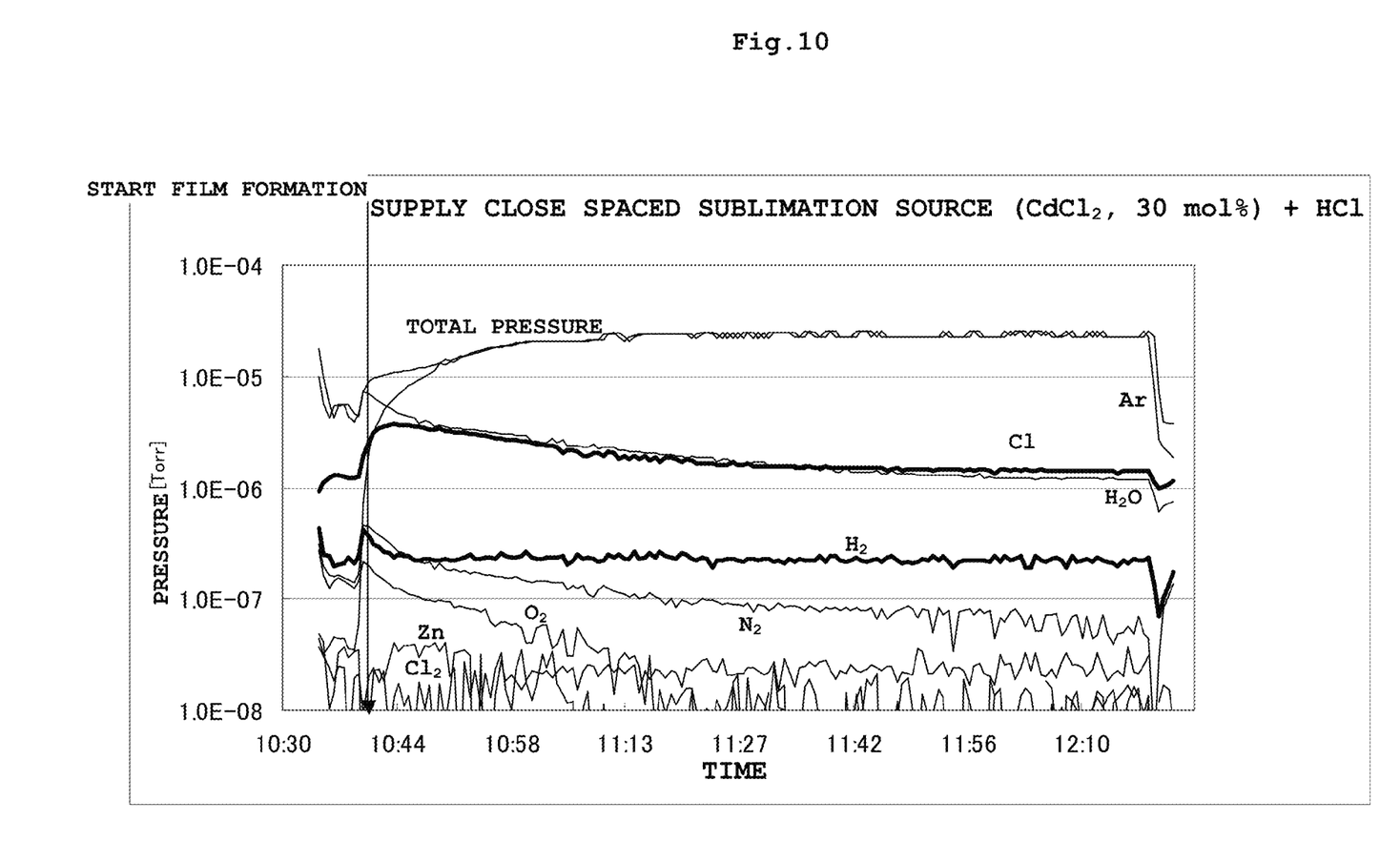
FIG. 10 is experimental data showing temporal variations in pressure for every component within the chamber when $CdCl_2$ is used as the source and HCl is also used as an additional source.

FIG. 9 illustrates experimental data showing of variations with time in pressure within a chamber for every component using $CdCl_2$ only as a source, whereas FIG. 10 illustrates experimental data showing of variations with time in pressure within a chamber for every component using $CdCl_2$ as a source and HCl as an additional source.

It can be seen from the experimental data that among the components within the chamber, components (Cl, $H_2$) of HCl (hydrogen chloride) decreases with time when a polycrystalline film or a polycrystalline lamination film is formed by close spaced sublimation method only with the source as shown in FIG. 9. On the other hand, it can also be seen that a component HCl among the components within the chamber does not decrease with time when HCl for another Cl component other than the source is supplied as an additional source.

This invention has been made regarding the state of the art noted above, and its object is to provide a method of manufacturing a radiation detector that can achieve uniform crystal particles and uniform detection characteristics.

SUMMARY

This invention is configured as under to achieve the above object. One example of this invention discloses a method of manufacturing a radiation detector having a radiation-sensitive detecting layer as a substrate. The method includes forming the detection layer having a first process and a second process. In the first process, a polycrystalline film or a polycrystalline lamination film is formed by vapor deposition or sublimation using as a source a first material containing at least one of simple substance Cd (cadmium), simple substance Te (tellurium), simple substance Zn (zinc), CdTe (cadmium telluride), ZnTe (zinc telluride), and CdZnTe (cadmium telluride zinc). In the second process, simple substance Cl (chlorine) or a Cl compound other than the source is supplied as an additional source at the start or in the course of the first process, and is heated to grow the polycrystalline film or the polycrystalline lamination film.

[Operation and Effect]

With the method of manufacturing the radiation detector according to the example of this invention, another additional source other than the source made from the first material is supplied at the start of or during the first process. Since Cl is contained in the addition source, Cl is continuously supplied from the start or in the course until the end of the first process. Thus, the polycrystalline film or the polycrystalline lamination film of CdTe, ZnTe, or CdZnTe can be doped with Cl uniformly in a thickness direction from the start or in the course until the end of the first process in the film formation. Consequently, radiation detector with excellent detecting characteristics (sensitivity, responsibility, etc.) of radiation can be manufactured while maintaining a lower leakage current. As a result, the uniform crystal particles and the uniform detection characteristics can be achieved.

The source used in the first process mentioned above is a mixture of the aforementioned first material and the second material containing at least one of $CdCl_2$ (cadmium chloride) and $ZnCl_2$ (zinc chloride). In the aforementioned first process, the polycrystalline film or the polycrystalline lamination film may be formed by vapor deposition or sublimation using the source composed of the mixture of the first material and the second material. In this case, since Cl is contained in the source composed of the mixture of the first material and the second material, the detecting layer formed by the polycrystalline film or the polycrystalline lamination film with vapor deposition or sublimation is formed in the first process, and simultaneously Cl is contained in the detecting layer. Although Cl is no longer supplied from the source in the course of the first process, another addition source other than the source is supplied at the start or in the course of the first process. Since the additional source contains Cl, Cl is continuously supplied from the start until the end of the first process. Thus, the polycrystalline film or the polycrystalline lamination film of CdTe, ZnTe, or CdZnTe can be doped with Cl uniformly in the thickness direction from the start until the end of the film formation. Consequently, a radiation detector with excellent detecting characteristics (sensitivity, responsibility, etc.) of radiation can be manufactured while maintaining a lower leakage current. As a result, the uniform crystal particles and the uniform detection characteristics can be achieved.

In the example of the manufacturing method, the aforementioned first process is performed within a chamber, and the additional source may be placed within the chamber for performing the aforementioned second process within the chamber. Alternatively, the additional source may be placed out of a chamber and may be supplied into the chamber for performing the aforementioned second process within the chamber. When the additional source is placed within the chamber as in the former, Cl vapor of especially high concentration can be supplied on a surface of the substrate especially within the chamber. Consequently, the polycrystalline film or the polycrystalline lamination film of CdTe, ZnTe, or CdZnTe can be doped with Cl of high-concentration. When the additional source is placed out of the chamber and is supplied into the chamber as in the latter, temperature control is possible independently of the aforementioned chamber. Consequently, the polycrystalline film or the polycrystalline lamination film of CdTe, ZnTe, or CdZnTe can be doped with Cl through sufficient control.

Moreover, when the additional source is placed out of the chamber and is supplied into the chamber as in the latter, it is preferable to supply gas. In this case, the additional source is preferably HCl (hydrogen chloride), $Cl_2$, $CHCl_3$ (chloroform), or gas obtained through diluting thereof with $N_2$, $O_2$, $H_2$, or rare gas. In the case of gas, the polycrystalline film or the polycrystalline lamination film of CdTe, ZnTe, or CdZnTe can be uniformly doped with Cl efficiently.

The additional source is not limited to the gas mentioned above. It may be a solid or a liquid as long as Cl is contained therein. For instance, the addition source may be $CdCl_2$ (cadmium chloride), $ZnCl_2$ (zinc chloride), or a mixture thereof. Alternatively, the addition source may be a liquid containing Cl (chlorine). In the case of solid, the polycrystalline film or the polycrystalline lamination film of CdTe, ZnTe, or CdZnTe can be doped with Cl safely. The additional source in solid or in liquid is applicable to both the cases when the additional source is placed within the chamber and when the additional source is placed out of the chamber.

With the method of manufacturing the radiation detector according to the example of this invention, the additional source other than the source made from the first material is supplied at the start or in the course of the first process. Thus, the polycrystalline film or the polycrystalline lamination film of CdTe, ZnTe, or CdZnTe can be doped with Cl uniformly in the thickness direction from the start or in the course until the end of the first process in the film formation. As a result, the uniform crystal particles and the uniform detection characteristics can be achieved.

DESCRIPTION OF REFERENCES

1 . . . radiation detector
3 . . . support substrate
9 . . . detecting layer
33 . . . vapor-deposition chamber
39 . . . heater
S' . . . source
S' . . . additional source

DETAILED DESCRIPTION

Example 1

Figure 1:
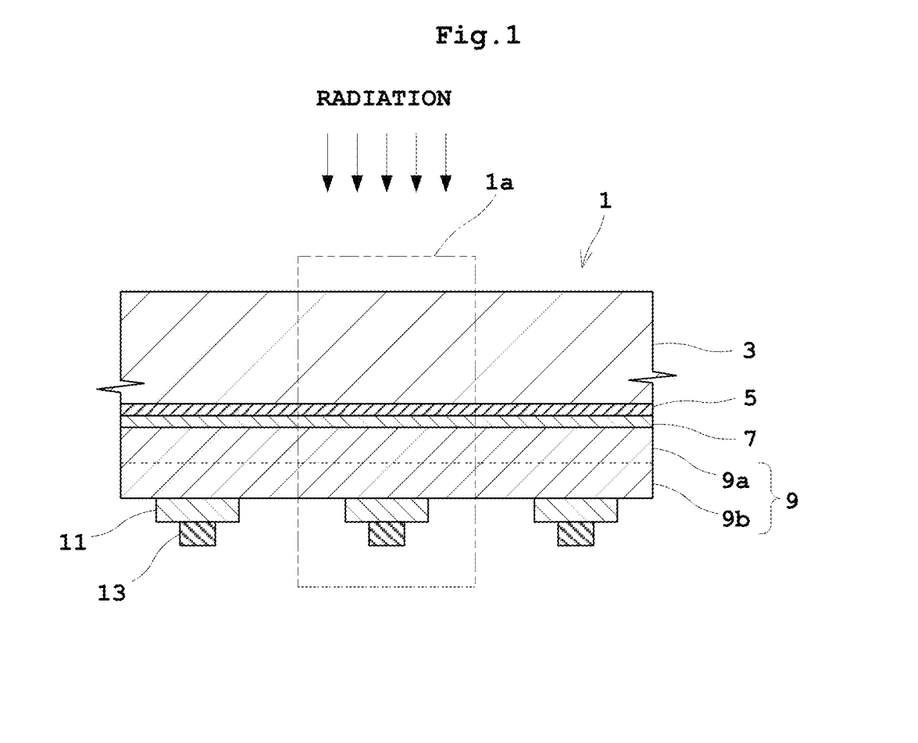
FIG. 1 is a longitudinal sectional view showing a radiation detector according to Examples 1 and 2 of this invention.
Figure 2:
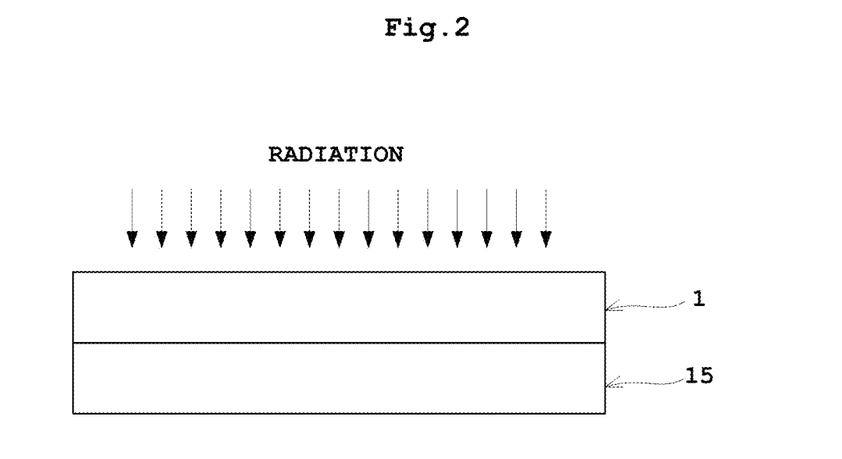
FIG. 2 is a schematic side view of a radiographic apparatus.
Figure 3:
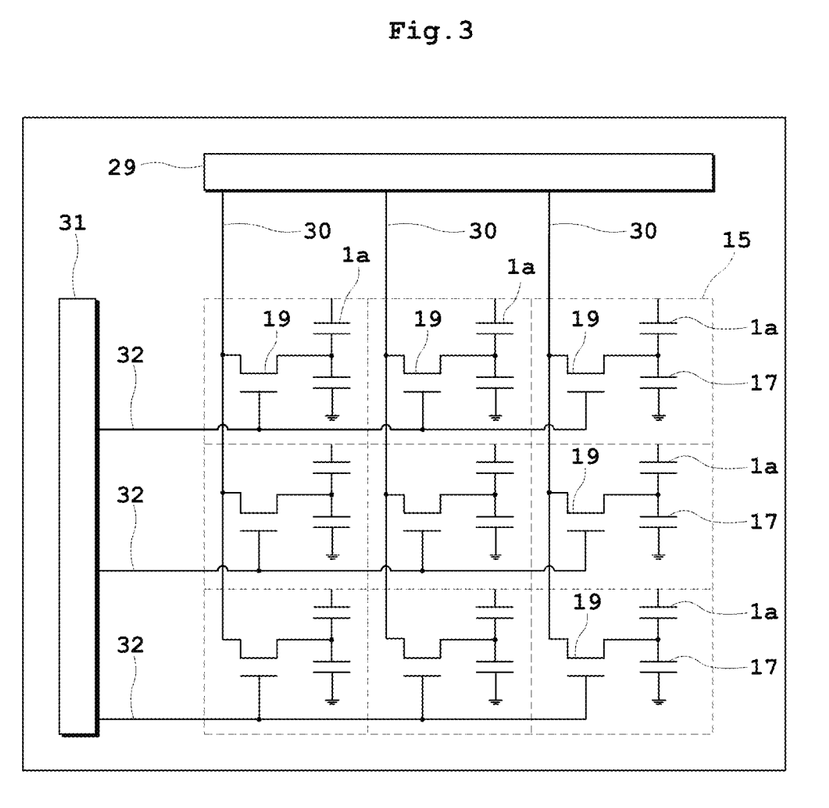
FIG. 3 is a circuit diagram showing a switching matrix substrate and adjacent circuits.
Figure 4:
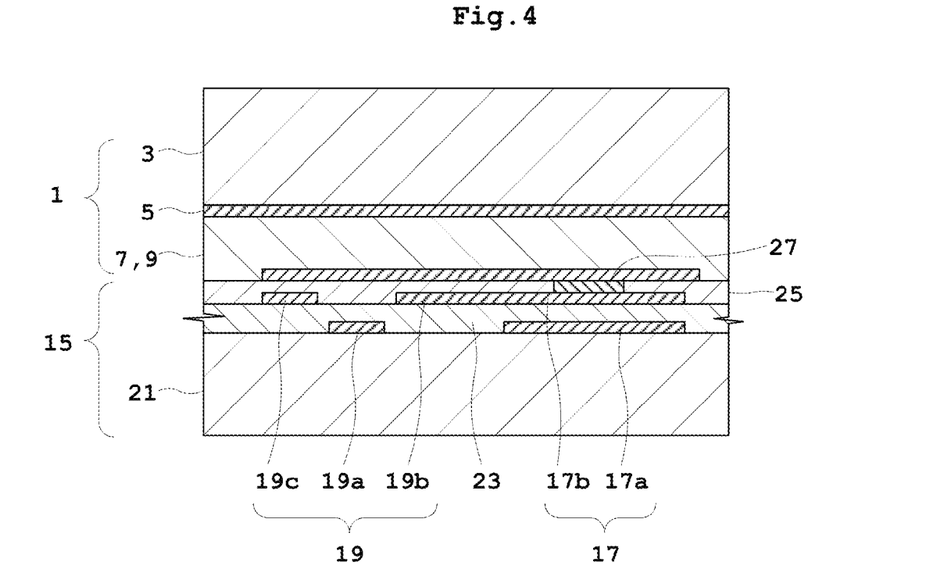
FIG. 4 is a schematic sectional view of the radiographic apparatus.

Example 1 of this invention will be described in detail hereinafter with reference to the drawings. FIG. 1 is a longitudinal sectional view showing a radiation detector according to Examples 1 and 2 of this invention. FIG. 2 is a schematic side view of a radiographic apparatus. FIG. 3 is a circuit diagram showing a switching matrix substrate and adjacent circuits. FIG. 4 is a schematic sectional view of the radiographic apparatus.

A radiation detector 1 includes a support substrate 3 having permeability to radiation; a common electrode 5 for applying a bias voltage formed on a lower surface of the support substrate 3; an electron-injection blocking layer 7 formed on a lower surface of the common electrode 5; a detecting layer 9 for generating electron-hole pair carriers in response to incident radiation; hole injection blocking layers 11 formed on a lower surface of the detecting layer 9; and detecting electrodes 13 for collecting the carriers. They are laminated. As long as the radiation detector 1 has no problem on its properties, either the electron-injection blocking layer 7 or the hole-injection blocking layer 7, or both of them may be omitted.

The above support substrate 3 preferably has a small radiation absorbing coefficient, and materials such as glass, ceramic ($Al_2O_3$, AlN), and silicon, for example, are employable therefor. The common electrode may be omitted by using a conductive material such as a graphite substrate. In Example 1 and also in Example 2 to be mentioned later, radiation enters from a support substrate 3 side as shown in drawings. The common electrode 5 operates while a negative bias voltage is applied thereto.

It is preferable that the detecting layer 9 is manufactured as described hereinafter. The detecting layer 9 is formed by polycrystalline films 9a and 9b formed any of CdTe or CdZnTe, or a polycrystalline laminated film containing at least one of them, and is further doped with Cl.

The common electrode 5 and the detecting electrodes 13 are formed of a conductive material such as ITO, Au or Pt, for example. The electron-injection blocking layer 7 is, for example, a $Sb_2Te_3$, $Sb_2S_3$ or ZnTe film forming a p-type layer. The hole-injection blocking layer 11 is, for example, a CdS or ZnS film forming a n-type layer.

As shown in FIG. 2, the radiation detector 1 having the above configuration is integrated with a switching matrix substrate 15 to function as a radiographic apparatus. Consequently, carriers generated in the detecting layer 9 of the radiation detector 1 are collected for every element by the switching matrix substrate 15, and are stored for every element to be read as electric signals.

The switching matrix substrate 15 as shown in FIG. 3 is provided, for each detecting element 1a in FIG. 1, with a condenser 17 as a charge storage capacity and a thin film transistor 19 as a switching element. For expediency of description, FIG. 3 shows a matrix of 3×3 (pixels). In practice, however, the matrix substrate has more pixels, such as 1024× 1024.

FIG. 4 shows in detail the switching matrix substrate 15. That is, a laminate structure includes an earth side electrode 17a of the condenser 17 disposed on an upper surface of an insulating support substrate 21, a connecting side electrode 17b of the condenser 17 via an insulating film 23 on a gate electrode 19a of the thin film transistor 19, a source electrode 19b and a drain electrode 19c of the thin film transistor 19. Further, the upper surface thereof is covered with an insulating film 25 for protection.

The connection side electrode 17b and the source electrode 19b are simultaneously formed and made conductive. For the insulating films 23 and 25, a plasma SiN film is employable, for example. The radiation detector 1 and the switching matrix substrate 15 are aligned, and the detecting electrode 13 and the connecting side electrode 17b of the condenser 17 are aligned, which are connected together via an anisotropic conductive film (ACF) or an anisotropic conductive paste by heating and pressure bonding. Consequently, the radiation detector 1 and the switching matrix substrate 15 are bonded together to be integral with each other. At this time, the detecting electrode 13 and the connecting side electrode 17b are made conductive by an intervening conductive section 27.

Further, the switching matrix substrate 15 is provided with a readout drive circuit 29 and a gate drive circuit 31. The readout drive circuit 29 is connected to vertical readout wires 30 each linking drain electrodes 19c of the thin-film transistors 19 in the same column. The gate drive circuit 31 is connected to horizontal readout wires 32 each linking gate electrodes 19a of the thin-film transistors 19 in the same row. Although not shown, the readout drive circuit 29 includes a preamplifier connected to each readout wire 30.

Instead of the above, a configuration having the readout drive circuit 29 and the gate drive circuit 31 integrated with the switching matrix substrate 15 may be used.

Figure 5:
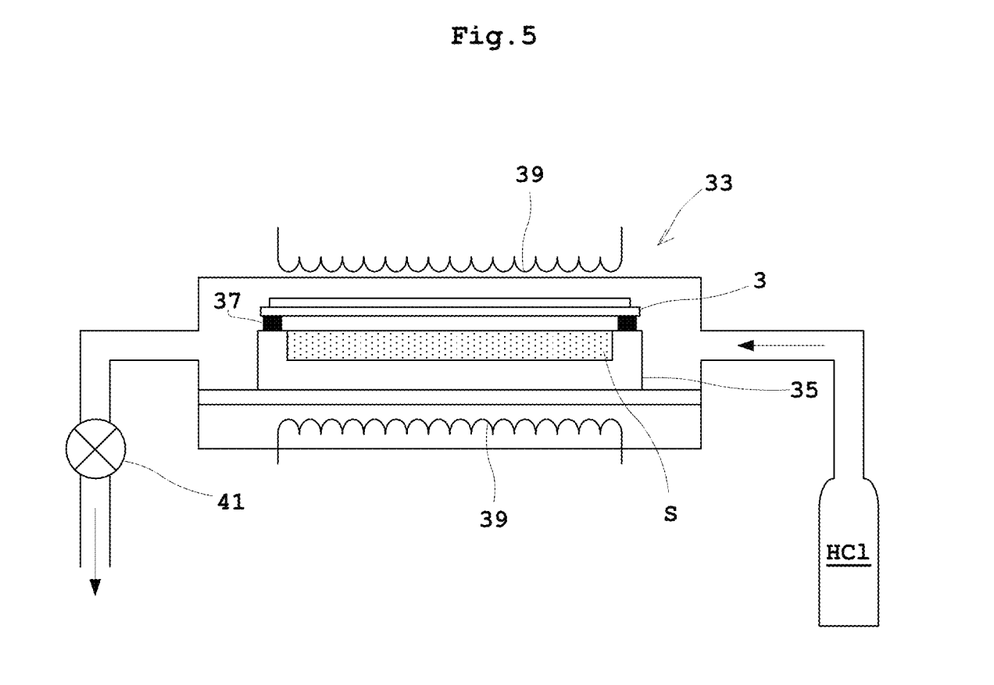
FIG. 5 is a schematic view showing one process of forming a detecting layer on the radiation detector according to Example 1.

Next, details of the method of manufacturing the above radiation detector 1 will be described with reference to FIG. 5. FIG. 5 is a schematic view showing one process of forming the detecting layer on the radiation detector according to Example 1.

The common electrode 5 of the radiation detector 1 is formed on one surface of the support substrate 3 by a method such as sputtering or vapor deposition. This is not needed when a conductive material such as a graphite substrate is used. Next, the electron-injection blocking layer 7 is laminated on a lower surface of the common electrode 5 by a method such as close spaced sublimation, sputtering, or vapor deposition. Then the detecting layer 9 is formed on a lower surface of the electron-injection blocking layer 7 by "close space sublimation" shown in FIG. 5.

Specifically, the support substrate 3 is placed within a vapor-deposition chamber 33. Since a lower susceptor 35 for placing a source S is arranged in the vapor-deposition chamber 33, the support base 3 is placed via a spacer 37 with a vapor-deposition surface thereof being directed downward. Heaters 39 are placed on upper and lower portions of the vapor-deposition chamber 33. A vacuum pump 41 operates to be a reduced-pressure atmosphere within the vapor-deposition chamber 33, and then the upper and lower heaters 39 heat the source S. Moreover, Cl-containing gas, such as HCl (hydrogen chloride) is supplied from outside the vapor-deposition chamber 33 into the vapor-deposition chamber 33 while a flow rate of the gas is controlled. Consequently, Cl supplied from outside is introduced while the source S is sublimated, and a polycrystalline film of CdTe, ZnTe, or CdZnTe doped with a desired amount (from 1 wtppm to 10 wtppm) of Cl has been doped is bonded on the lower surface of the support substrate 3 to form the detecting layer 9. Here, the detecting layer 9 is formed as a thick film having a thickness of around 600 μm, and a surface thereof is flattered by grinding, etc., for integrally bonding to the switching matrix substrate 15. Accordingly, the detecting layer 9 is made having a thickness of around 400 μm.

Examples of the source S set on the lower susceptor 35 include a mixture of the first material containing at least one of simple substance Cd (cadmium), simple substance Te (tellurium), simple substance Zn (zinc), CdTe (cadmium telluride), ZnTe (zinc telluride), and CdZnTe (cadmium telluride zinc) and the second material containing at least one of $CdCl_2$ (cadmium chloride) and $ZnCl_2$ (zinc chloride). The mixture is sintered by being heated in advance under a normal pressure and inert atmosphere prior to film formation.

For instance, CdTe containing $CdCl_2$ is firstly set as the source S, and then is processed while Cl-containing gas is supplied from outside. Thereafter, the source S is replaced with ZnTe which containing $CdCl_2$, and similar process is performed again. Consequently, a CdTe film containing Cl is formed on a first layer 9a of the detecting layer 9, and a ZnTe film containing Cl is formed on a second layer 9*b*. The detecting layer 9 may be formed by only one layer.

The detecting layer 9 is formed, and then the lower susceptor 35 is filled with $CdCl_2$ and $ZnC_2$ as the source as required, and are heated, whereby the surface of the detecting layer 9 is additionally doped with Cl. Specifically, the detecting layer 9 is doped with Cl by performing a heat treatment under a state where a powder including at least one of $CdCl_2$ and $ZnCl_2$ or its sintered body is placed opposite to the detecting layer 9.

A heat-treating atmosphere at this time, preferably, is an atmosphere maintained at one atmospheric pressure and including at least one of $N_2$, $O_2$, $H_2$ and a rare gas (He, Ne, Ar). It is further preferable that the heat-treating atmosphere at this time is an atmosphere maintained at $1.3 \times 10^{-4}$ to 0.5 atmospheric pressures and including at least one of $N_2$, $O_2$, $H_2$ and a rare gas (He, Ne, Ar).

Since treatment can be carried out at low temperatures by using such an atmosphere, a leak current can be reduced further when the detecting layer 9 is formed before additionally doped with Cl. Further, by maintaining the same temperature, a more amount of Cl can be supplied and treatment can be done in a short time. Moreover, the source is not set on the lower susceptor 35, and the detecting layer 9 is additionally doped with Cl by supplying gas containing atoms of Cl to the detecting layer 9 and heating it. Such configuration may be adopted. Additional dope with Cl as noted above can achieve suitable protection of crystal particle boundaries.

Next, a semiconductor layer for the hole-injection blocking layer 11 is formed on the surface of the detecting layer 9 by electrodepositing, sputtering, vapor deposition or the like. The hole-injection blocking layer 11 is patterned as required, and is separated for every pixel. However, when the hole-injection blocking layer 11 has no bad effect, such as a space resolution, that occurs due to high resistance and adjacent pixel leak, patterning is not needed. Likewise, a metal film for detecting electrodes 13 is laminated, and then is patterned to form detecting electrodes 13. The radiation detector 1 is formed by the above process.

And, as described above, the switching matrix substrate 15 and radiation detector 1 are integrated to complete the radiographic apparatus. As one technique, conductive bump electrodes, such as carbon, are formed by screen printing on the pixel electrodes (herein, the detecting electrodes 13) on the surface of either the switching matrix substrate 15 or the radiation detector 1, and both are joined and bonded with a press machine. Such technique is applicable. Conductive bump electrodes may be formed on portions corresponding to pixels, without forming pixel electrodes, and both may be joined together.

According to the method of manufacturing the radiation detector 1 mentioned above, an additional source (herein HCl of Cl-containing gas) other than the source composed of the first material is supplied at the start of or in the course of the first process (which is referred to as a "second process.") Since the additional source contains Cl, Cl is continuously supplied from the start until the end of the first process. Thus, the polycrystalline film or the polycrystalline lamination film (the detecting layer 9) of CdTe, ZnTe, or CdZnTe can be doped with Cl uniformly in a thickness direction from the start until the end of the film formation. Then the radiation detector 1 with excellent detecting characteristics (sensitivity, responsibility, etc.) of radiation can be manufactured while maintaining a lower leakage current. As a result, the uniform crystal particles and the uniform detection characteristics can be achieved.

In Example 1, the source used in the first process mentioned above is a mixture of the aforementioned first material and the second material containing at least one of $CdCl_2$ (cadmium chloride) and $ZnCl_2$ (zinc chloride). In the aforementioned first process, the polycrystalline film or the polycrystalline lamination film may be formed by vapor deposition or sublimation using the source composed of the mixture of the first material and the second material. In this case, since Cl is contained in the source composed of the mixture of the first material and the second material, the detecting layer formed by the polycrystalline film or the polycrystalline lamination film by vapor deposition or sublimation is formed in the first process, and simultaneously Cl is contained in the detecting layer. Although Cl is no longer supplied from the source in the course of the first process, another additional source (HCl as Cl-containing gas) other than the source is supplied at the start or in the course of the first process. Thus, the polycrystalline film or the polycrystalline lamination film of CdTe, ZnTe, or CdZnTe can be doped with Cl uniformly in the thickness direction from the start until the end of the film formation. Then the radiation detector with excellent detecting characteristics (sensitivity, responsibility, etc.) of radiation can be manufactured while maintaining a lower leakage current. As a result, the uniform crystal particles and the uniform detection characteristics can be achieved.

The additional source may be supplied simultaneously with the start of the first process to perform the second process. Alternatively, the additional source may be supplied in the course of the first process to perform the second process. A time when Cl is no longer supplied during the film formation is judged, and the additional source may be supplied at the time or just before the time to perform the second process.

In Example 1, the aforementioned first process is performed within the vapor-deposition chamber 33. The additional source is placed out of the vapor-deposition chamber 33, and is supplied into the vapor-deposition chamber 33. Thereby the aforementioned second process is performed within the vapor-deposition chamber 33. When the additional source is placed outside of the vapor-deposition chamber 33 and is supplied into the vapor-deposition chamber 33, temperature control (see, for example FIG. 7) is possible independently of the aforementioned vapor-deposition chamber 33. Consequently, the polycrystalline film or the polycrystalline lamination film of CdTe, ZnTe, or CdZnTe can be doped with Cl through sufficient control.

As in Example 1, Cl-containing gas is supplied when the additional source is placed out of the vapor-deposition chamber 33 and is supplied into the vapor-deposition chamber 33. Example 1 adopts HCl (hydrogen chloride). HCl may be replaced with gas diluted with $N_2$, $O_2$, $H_2$, or rare gas (e.g., Ar). $Cl_2$, $CHCl_3$ (chloroform) may be adopted instead of HCl. Gas obtained through diluting $Cl_2$ or $CHCl_3$ with $N_2$, $O_2$, $H_2$, or rare gas may be adopted. In the case of gas, the polycrystalline film or the polycrystalline lamination film of CdTe, ZnTe, or CdZnTe can be doped uniformly with Cl efficiently.

Upon formation of the polycrystalline film of the polycrystalline lamination film of CdTe, ZnTe, or CdZnTe, when either Cd, Te or Zn lacks, the source may be compensated with simple substance Cd, simple substance Te, or simple substance Zn.

<Comparison of Experimental Data>

A crystal obtained by the method of Example 1 has been confirmed through experiments. Description will be given of comparison of experimental data with reference to FIG. 8. FIG. 8 is experimental data showing a relationship between a crystal particle diameter and pixel variation in sensitivity.

A CdZnTe film A is a film doped with Cl positively with the method described in Example 1 (film Cl-concentration of 3.1 wtppm), and having microfacricated crystal particles (average particle diameter of less than 75 µm). A CdZnTe film B is formed without being doped with Cl intentionally as conventional (film Cl-concentration of 0.5 wtppm), and has rough crystal particles (particle diameter of 200 µm to 300 µm). FIG. 8 shows each film characteristics (FIG. 8(a) is a section morphology, FIG. 8(b) is an XRD spectrum, and FIG. 8(c) is input-output characteristic for every pixel).

As is apparent from the sectional morphology in FIG. 8(a), it has been confirmed that the CdZnTe film A has uniform crystals particles by Cl and an average particle diameter of less than 75 µm. On the other hand, in the sectional morphology in FIG. 8(a), the other film is not intentionally doped with Cl. Consequently, Cl is supplied only on a substrate interface at early film formation. Thus large variation occurs between the crystal particles adjacent to the interface and those other than the interface. Moreover, the particle diameter is clearly larger in the crystal particles other than the interface, and the particle diameter varies between 200 µm and 300 µm. Such has been confirmed.

The crystal particle diameter also becomes large as the CdTeZn film B grows. Thus, the XRD spectrum shows single orientation. Here, a (511) crystal face and a (111) crystal face are in a twin-crystal relationship, and thus does not show many orientations. On the other hand, a minute particle diameter of the CdTeZn film A is maintained even when the film grows. Thus the XRD spectrum also shows typical many orientations.

It has been confirmed, from input/output characteristic data for every pixel, that the radiation detector using the CdTeZn film B has large variations in sensitivity among pixels, whereas the radiation detector using the CdTeZn film A has suppressed variations in sensitivity among pixels and can obtain a relatively uniform image (the image not shown.)

In addition, as mentioned for the experimental data of FIGS. 9 and 10, when HCl is supplied as the additional source for the Cl compound other than the source, the HCl compound among the components within the chamber does not decrease with time. As a result, Cl is continuously supplied by the additional source without being consumed within the chamber during the film formation, which has been confirmed from the experimental data of FIG. 10.

Example 2

Figure 6:
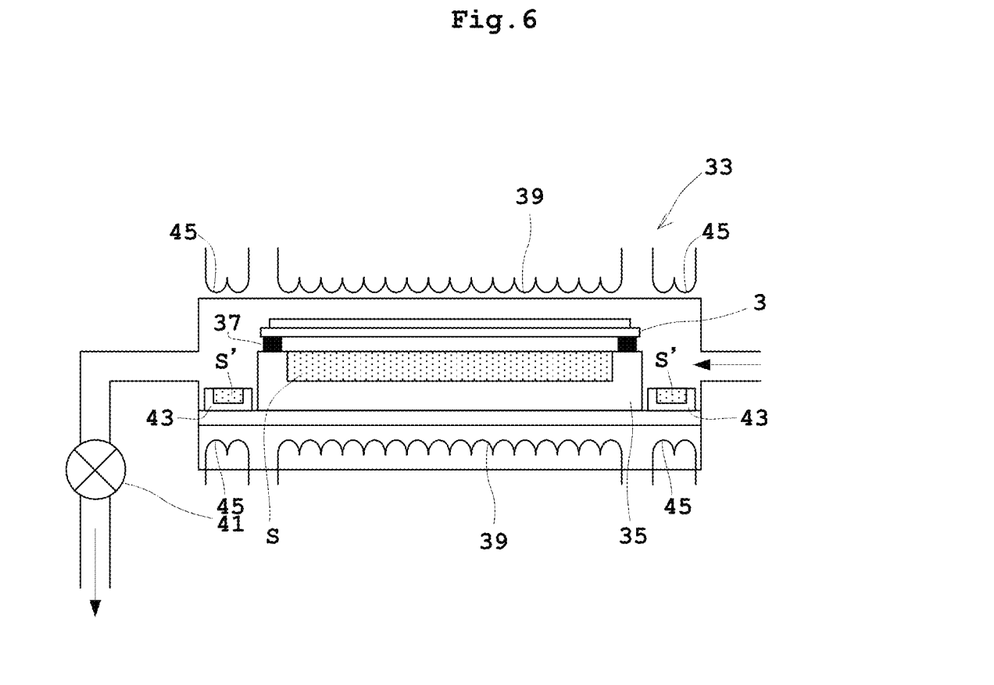
FIG. 6 is a schematic view showing one process of forming a detecting layer on a radiation detector according to Example 2.

Next, Example 2 of this invention will be described in detail hereinafter with reference to the drawings. FIG. 6 is a schematic view showing one process of forming a detecting layer on the radiation detector according to Example 2. Example 2 has the same configuration of the radiation detector 1 and the switching matrix substrate 15 as that of Example 1. Thus, the description thereof is to be omitted.

In Example 2, similar to Example 1, a support substrate 3 is placed within a vapor-deposition chamber 33. A lower susceptor 35 is arranged for placing the source S. Heaters 39 are provided on upper and lower portions of the vapor-deposition chamber 33. In Example 2, a lower susceptor 43 for placing an addition source S' is placed within the vapor deposition chamber 33 adjacent to lower susceptor 35 for placing the source S. Auxiliary heaters 45 are provided on the upper and lower portions of the vapor-deposition chamber 33 that face to the additional source S'. They heat the additional source S'. When the additional source S' is sublimated with the heaters 39, the auxiliary heaters 45 are not always necessary. Here in FIG. 6, the additional sources S' are placed on both sides. Alternatively, the additional source S' may be placed only one side.

Similar to Example 1, a vacuum pump 41 operates to generate a reduced-pressure atmosphere within the vapor-deposition chamber 33, and then the upper and lower heaters 39 heat the source S. Additionally, in Example 2, the auxiliary heaters 45 within the vapor-deposition chamber 33 heat the additional source S'. Consequently, Cl supplied due to sublimation of the additional source S' is introduced while the source S is sublimated, and a polycrystalline film of CdTe, ZnTe, or CdZnTe doped with a desired amount of Cl (1 wtppm to 10 wtppm) is bonded on a lower surface of the support substrate 3 to form a detecting layer 9. Similar to Example 1, the detecting layer 9 is formed to be a thick film having a thickness of around 600 µm, and then a surface thereof is flattered by grinding, etc., to have a thickness of around 400 µm.

Examples of the additional source S' set on the lower susceptor 43 include $CdCl_2$ (cadmium chloride), $ZnCl_2$ (zinc chloride), or a mixture thereof. The mixture is sintered by being heated in advance under a normal pressure and inert atmosphere prior to film formation. The mixture is not limited to a solid as above. It may be a liquid containing Cl (chlorine). In the case of liquid, it may be an HCl solution, or may be $CHCl_3$ (chloroform) or $CCl_4$ (carbon tetrachloride). Moreover, in the case of liquid, it is evaporated by heating with the auxiliary heaters 45, and Cl is introduced.

Similar to Example 1, the detecting layer 9 is formed, and then the detecting layer 9 is additionally doped with Cl as required. Here, a condition is same as that in Example 1. Since manufacturing of those other than the detecting layer 9 is same as that in Example 1, explanation thereof is to be omitted.

With the method of manufacturing the radiation detector 1 according to the example of this invention mentioned above, similar to Example 1, another additional source S' other than the source is supplied at the start or in the course of the first process even when Cl is no longer supplied from the source in the course of the first process. Thus, the polycrystalline film or the polycrystalline lamination film of CdTe, ZnTe, or CdZnTe can be doped with Cl uniformly in a thickness direction from the start until the end of the film formation. As a result, the uniform crystal particles and the uniform detection characteristics can be achieved.

The additional source S' may be heated with the heaters 39 or the auxiliary heaters 45 simultaneously with the start of the first process to perform the second process. Alternatively, the additional source S' may be heated with the auxiliary heaters 45, or may be heated using remaining heat from the heaters 39 in the course of the first process to perform the second process. A time when Cl is no longer supplied during the film formation is judged, and then the additional source S' may be heated with the auxiliary heaters 45 at the time or just before the time or it may be placed and heated expecting a temperature gradient of the heaters 39 to perform the second process.

In Example 2, the aforementioned first process is performed within the vapor-deposition chamber 33. The additional source S' is placed within the vapor-deposition chamber 33, and the aforementioned second process is performed within the vapor-deposition chamber 33. When the additional source S' is placed within the vapor-deposition chamber 33, Cl vapor of especially high concentration can be supplied on the surface of the substrate within the chamber 33. Consequently, the polycrystalline film or the polycrystalline lamination film of CdTe, ZnTe, or CdZnTe can be doped with Cl of high-concentration.

When the additional source is a solid, the polycrystalline film or the polycrystalline lamination film of CdTe, ZnTe, or CdZnTe can be doped safely with Cl. The additional source in solid or in liquid is applicable to both the cases when the additional source is placed within the chamber 33 as in Example 2 and when the additional source is placed out of the chamber 33 as in Example 1.

This invention is not limited to the foregoing embodiment, but may be modified as follows:

(1) In each example mentioned above, radiation to be detected may be exemplified by X-rays, gamma-rays, light, or the like, and thus is not particularly limited.

Figure 7:
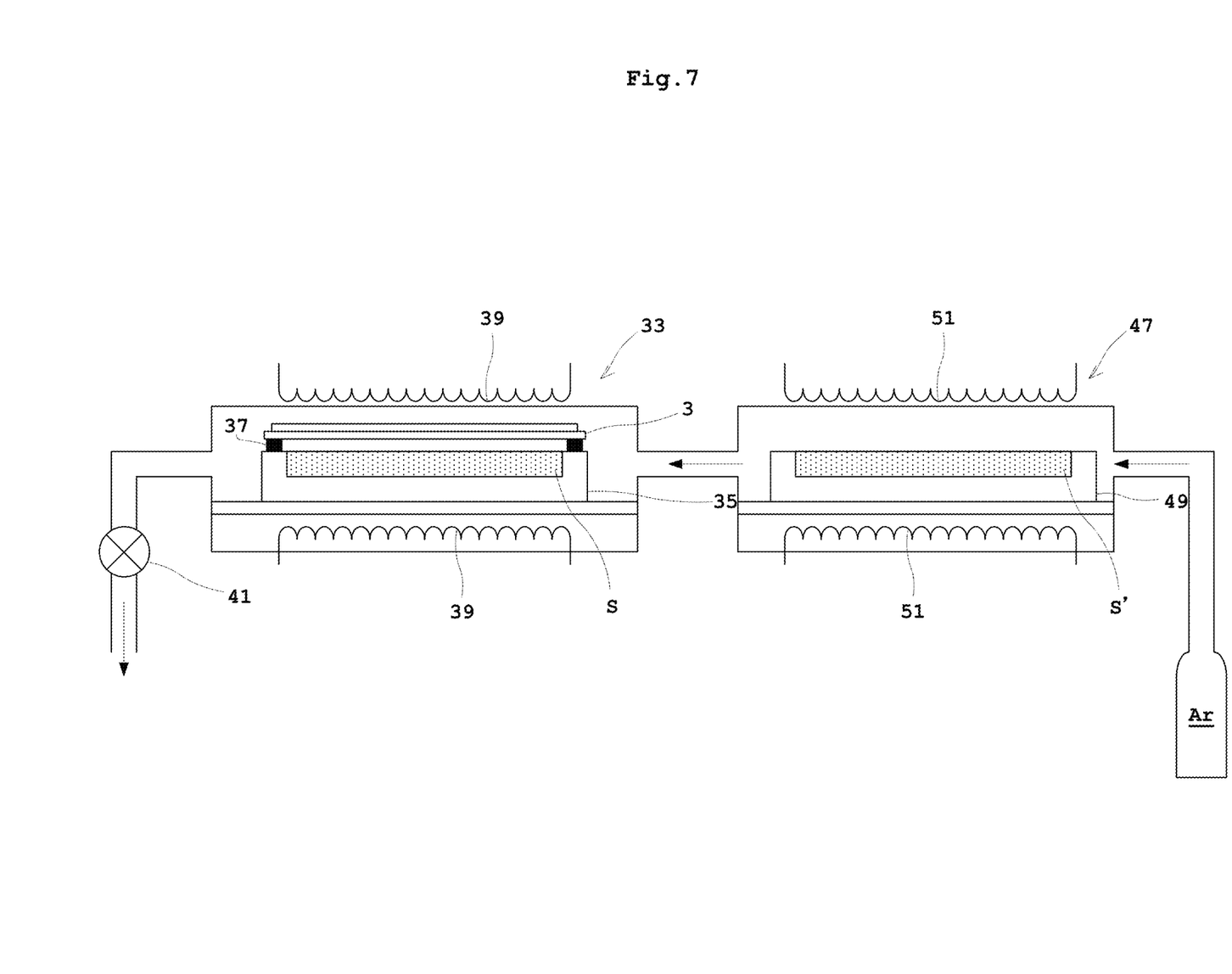
FIG. 7 is a schematic view showing one process of forming a detecting layer on a radiation detector according to one modification.

(2) In Example 1 mentioned above, the additional source is placed out of the vapor-deposition chamber 33 as shown in FIG. 5 and is supplied into the vapor-deposition chamber 33. Alternatively, as shown in FIG. 7, a chamber 47 for performing temperature control may be provided besides the vapor-deposition chamber 33. The chamber 47 includes therein a lower susceptor 49 for placing the additional source S', and includes heaters 51 on upper and lower portions thereof. Similar to Example 2, the additional source S' in solid or liquid is adopted. The additional source S' is heated with the heaters 51 while $N_2$, $O_2$, $H_2$, or rare gas (e.g., Ar) is supplied into the chamber 47. Thereby Cl diluted by $N_2$, $O_2$, $H_2$, or rare gas is supplied into the vapor-deposition chamber 33 to perform the second process within the vapor-deposition chamber 33. Since the chamber 47 can perform temperature control with the heaters 51 independently of the vapor-deposition chamber 33, the polycrystalline film or the polycrystalline lamination film of CdTe, ZnTe, or CdZnTe can be doped with Cl through sufficient control.

(3) In each example mentioned above, the source S is a mixture of the first material containing at least one of simple substance Cd (cadmium), simple substance Te (tellurium), simple substance Zn (zinc), CdTe (cadmium telluride), ZnTe (zinc telluride), and CdZnTe (cadmium telluride zinc) and the second material containing at least one of $CdCl_2$ (cadmium chloride) and $ZnCl_2$ (zinc chloride). Alternatively, the source S may be only the first material without containing Cl. In this case, supplying Cl or the Cl compound as the additional source can produce a similar effect to that in each example.

The invention claimed is:

1. A method of manufacturing a radiation detector having a radiation-sensitive detecting layer, comprising:
a first process for forming a polycrystalline film or a polycrystalline lamination film on a substrate by vapor deposition or sublimation using a first material containing at least one of Cd (cadmium) in elemental form, Te (tellurium) in elemental form, Zn (zinc) in elemental form, CdTe (cadmium telluride), ZnTe (zinc telluride), and CdZnTe (cadmium telluride zinc) as a first source; and
a second process for supplying a Cl (chlorine) containing gas or a Cl compound as a second source separate and independent from the first source at a start or in a course of the first process, and heating the substrate to grow the polycrystalline film or the polycrystalline lamination film.

2. The method of manufacturing the radiation detector according to claim 1, wherein:
the first source used in the first process is a mixture of the first material and a second material containing at least one of $CdCl_2$ (cadmium chloride) and $ZnCl_2$ (zinc chloride), and
in the first process, the polycrystalline film or the polycrystalline lamination film is formed by vapor deposition or sublimation using the source composed of the mixture of the first material and the second material.

3. The method of manufacturing the radiation detector according to claim 2, wherein the mixture is sintered by being heated in advance under a normal pressure and inert atmosphere prior to film formation of the detecting layer.

4. The method of manufacturing the radiation detector according to claim 1, wherein:
the first process is performed within a chamber, and
the second source is placed within the chamber for performing the second process in the chamber.

5. The method of manufacturing the radiation detector according to claim 4, wherein
the second source is heated while the first source is sublimated by heating the first source with heaters.

6. The method of manufacturing the radiation detector according to claim 5, wherein
the heaters are placed on upper and lower portions of the chamber.

7. The method of manufacturing the radiation detector according to claim 5, wherein
the second source is heated using remaining heat from the heaters to perform the second process.

8. The method of manufacturing the radiation detector according to claim 4, wherein
the first source is heated with heaters to be sublimated, and
the second source is heated with auxiliary heaters other than the heaters.

9. The method of manufacturing the radiation detector according to claim 8, wherein
the heaters are placed on upper and lower portions of the chamber.

10. The method of manufacturing the radiation detector according to claim 8, wherein
the auxiliary heaters are placed on upper and lower portions of the chamber.

11. The method of manufacturing the radiation detector according to claim 8, wherein
the second source is heated with the heaters or the auxiliary heaters simultaneously with the start of the first process to perform the second process.

12. The method of manufacturing the radiation detector according to claim 8, wherein
the second source is heated with the auxiliary heaters in the course of the first process to perform the second process.

13. The method of manufacturing the radiation detector according to claim 1, wherein
the first process is performed in a first chamber, and
the second source is placed out of the first chamber and is supplied into the first chamber to perform the second process in the first chamber.

14. The method of manufacturing the radiation detector according to claim 13, wherein
the second source is heated while the first source is heated with heaters to be sublimated.

15. The method of manufacturing the radiation detector according to claim 14, wherein
the heaters are placed on upper and lower portions of the chamber.

16. The method of manufacturing the radiation detector according to claim 1, wherein
the first process is performed in a first chamber,
a second chamber is provided for supplying the second source to the first chamber, and
the second chamber is provided with heaters for performing temperature control independently of the first chamber.

17. The method of manufacturing the radiation detector according to claim 1, wherein
the second source is $CdCl_2$ (cadmium chloride), $ZnCl_2$ (zinc chloride), or a mixture thereof.

18. The method of manufacturing the radiation detector according to claim 17, wherein
the mixture is sintered by being heated in advance under a normal pressure and inert atmosphere prior to film formation of the detecting layer.

19. The method of manufacturing the radiation detector according to claim 1, wherein
the second source is a liquid containing Cl (chlorine).

20. The method of manufacturing the radiation detector according to claim 1, wherein
the second source is HCl (hydrogen chloride), $Cl_2$, $CHCl_3$ (chloroform), or gas obtained through diluting HCl, $Cl_2$ or $CHCl_3$ with $N_2$, $O_2$, $H_2$, or rare gas.

* * * * *